United States Patent
Yao

(10) Patent No.: US 8,021,973 B2
(45) Date of Patent: Sep. 20, 2011

(54) SYSTEM AND METHOD TO REDUCE THE BONDWIRE/TRACE INDUCTANCE

(75) Inventor: Weijun Yao, Mountain View, CA (US)

(73) Assignee: Ralink Technology (Singapore) Corporation, Singapore (SG)

(*) Notice: Subject to any disclaimer, the term of this patent is extended or adjusted under 35 U.S.C. 154(b) by 244 days.

(21) Appl. No.: 12/500,046

(22) Filed: Jul. 9, 2009

(65) Prior Publication Data

US 2011/0006440 A1    Jan. 13, 2011

(51) Int. Cl.
*H01L 21/44* (2006.01)
(52) U.S. Cl. ............... 438/617; 257/503; 257/E23.024
(58) Field of Classification Search .............. 257/503, 257/E23.024, E23.141; 438/617
See application file for complete search history.

(56) References Cited

U.S. PATENT DOCUMENTS 5,825,084 A * 10/1998 Lau et al. .............. 257/700
* cited by examiner

*Primary Examiner* — Quoc D Hoang
(74) *Attorney, Agent, or Firm* — Sawyer Law Group, P.C.

(57) ABSTRACT

A method and system for reducing the inductance on an integrated circuit. The method and system comprises providing a first differential line, including a first input and a first output, the first differential line including at least two bondwire traces which are coupled in parallel. The method and system also comprises providing a second differential line including a second input and a second output, the second differential line including at least two bondwire traces which are coupled in parallel, the first differential line being of opposite polarity to the second differential line. The method and system further comprises cross-coupling of the first input with the second input and the first output with the second output to reduce the inductance caused by bondwire traces. A technique in accordance with the invention uses the coupling factor K to help to further reduce the inductance. By changing the input ordering of differential bondwires/traces, the bondwire/trace magnetic coupling factor K can be used to reduce the line inductance.

6 Claims, 5 Drawing Sheets

SYSTEM AND METHOD TO REDUCE THE BONDWIRE/TRACE INDUCTANCE

FIELD OF THE INVENTION

The present invention relates generally to integrated circuits and more specifically to reducing the parasitic inductances for such circuits.

BACKGROUND OF THE INVENTION

Integrated circuits and/or packages include a plurality of traces for coupling different components together. The chip package bondwires (or onchip or on-board traces) usually has a large inductance. At high frequencies, this large inductance will cause a large RF swing. Furthermore, the large inductance will make the matching wideband applications more difficult.

The conventional way to reduce the inductance of the traces is to parallel multiple bondwires/traces. In this traditional approach, the magnetic coupling factor K has a negative effect on reducing the parallel bondwires/traces inductance. FIG. 1 illustrates the conventional technique to reduce the bondwire/trace inductance. L1-L4 are the chip bondwires, on-chip layout trace or board traces. In the case that L1-L4 are bondwires, P1 and P2 are connected to bondpads on die and P3 and P4 are connected to package pins. In the case that L1-L4 are differential traces on chip or on board, P1 and P2 are differential inputs and P3 and P4 are differential outputs. The conventional way to reduce the inductance is to parallel L1 and L2 (or L3 and L4) to make the effective inductance from P1 to P3 (or P2 to P4) smaller.

Let L1=L2=L3=L4=L, and inductance coupling factor is K. If coupling factor K=0, the effective inductance from P1 to P3 (or P2 to P4) Lpp=L1*L2/9L2+L2)=L/2. If K is not 0, the magnetic fields of the bondwires/traces will strengthen each other and the Lpp>L/2. Accordingly, the larger K is, the larger the Lpp. So the reduction from parallel bondwire approach does necessarily reduce the inductance.

Therefore the traditional method in some instances sometimes does not reduce the inductance. The larger K is, the larger the inductance. Accordingly, what is needed is a system and method to overcome the above-identified issues. The present invention addresses such a need.

SUMMARY OF THE INVENTION

A method and system is disclosed for reducing the inductance on an integrated circuit. The method and system comprise providing a first differential line, including a first input and a first output, the first differential line including at least two bondwire traces which are coupled in parallel. The method and system also comprise providing a second differential line including a second input and a second output, the second differential line including at least two bondwire traces which are coupled in parallel, the first differential line being of opposite polarity to the second differential line. The method and system further comprise cross-coupling of the first input with the second input and the first output with the second output to reduce the inductance caused by bondwire traces.

A technique in accordance with the present invention uses the coupling factor K to help to further reduce the inductance. By changing the input ordering of differential bondwires/traces, the bondwire/trace magnetic coupling factor K can be used to reduce the line inductance.

DETAILED DESCRIPTION

The present invention relates generally to integrated circuits and more specifically to reducing the parasitic inductances for such circuits. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

In an embodiment the inputs and outputs of the package are cross coupled. In this way, the coupling factor K will help to reduce the inductance rather than increase the inductance, because the magnetic fields of the adjacent bondwires/traces will cancel each other. To describe the features of the present invention refer now to the following description in conjunction with accompanying Figures.

Figure 1:
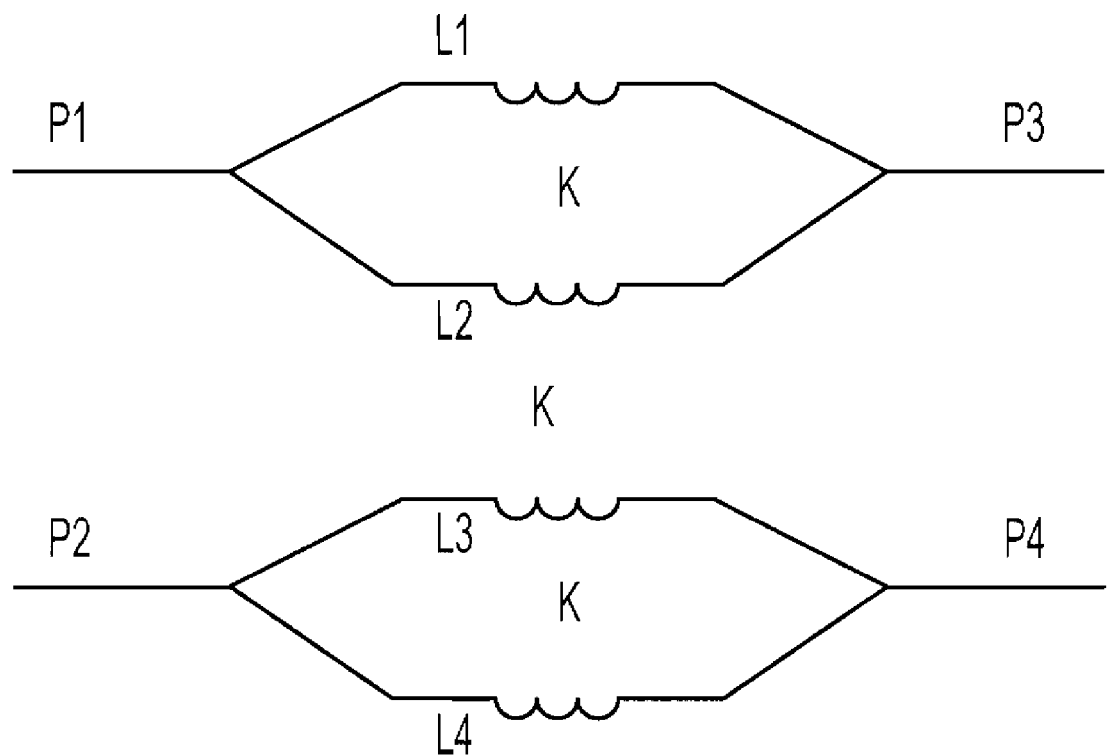
FIG. 1 illustrates a conventional system to reduce the bondwire/layout trace inductance.
Figure 2:
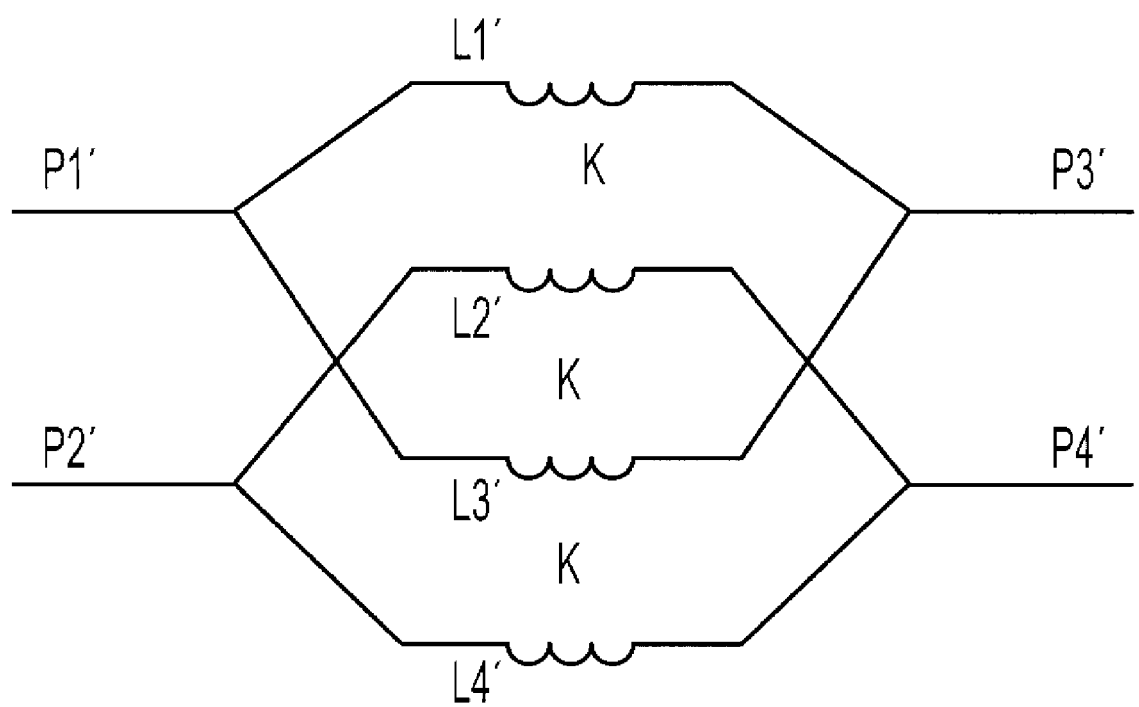
FIG. 2 illustrates a system in accordance with the present invention to reduce the bondwire/layout trace inductance.

FIG. 2 illustrates a method and system in accordance with the present invention to reduce the bondwire/layout trace inductance. As is seen, input P1' is cross coupled with input P2'. Similarly, output P3' is coupled with output P4'.

If coupling factor K=0, the effective inductance from P1 to P3 (or P2 to P4) is still Lpp=L1*L2/(L1+L2)=L/2. However, if K is not 0, the Lpp<L/2. In this example, Lpp ∝ (1−k), where 0<k<1. As can be seen from this equation, the larger K is, the smaller Lpp. So the inductor coupling factor K will help reduce the inductance when inputs and outputs are cross complex.

Figure 3:
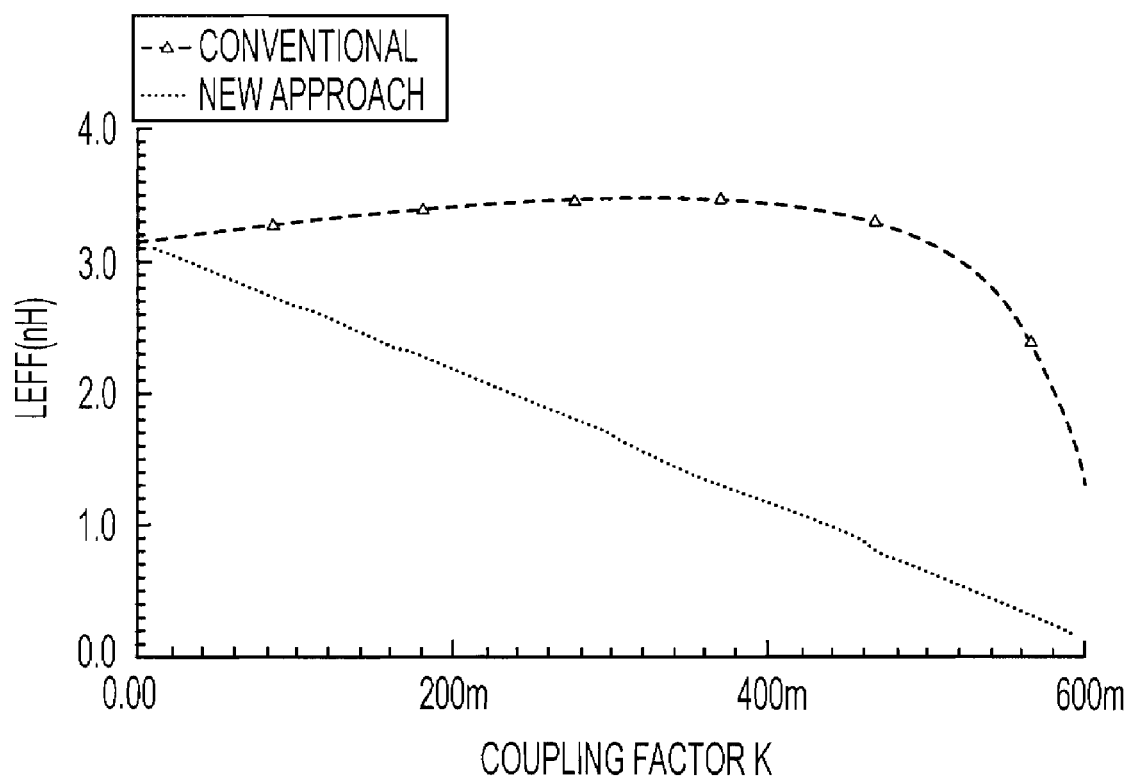
FIG. 3 shows simulation results of an approach in accordance with the present invention and the conventional approach.

FIG. 3 shows the simulation results of an approach in accordance with the present invention and the conventional approach. Y axis is the effective inductance Leff from P1 to P3 (or P2 to P4). Assuming L1=L2=L3=L4=6 nH. The coupling factor K range is between 0 to 0.6. At K=0, both approaches provide the same effective inductance (Leff)=3 nH. As K increases, the new approach provides a much smaller inductance than the conventional approach.

Figure 4:
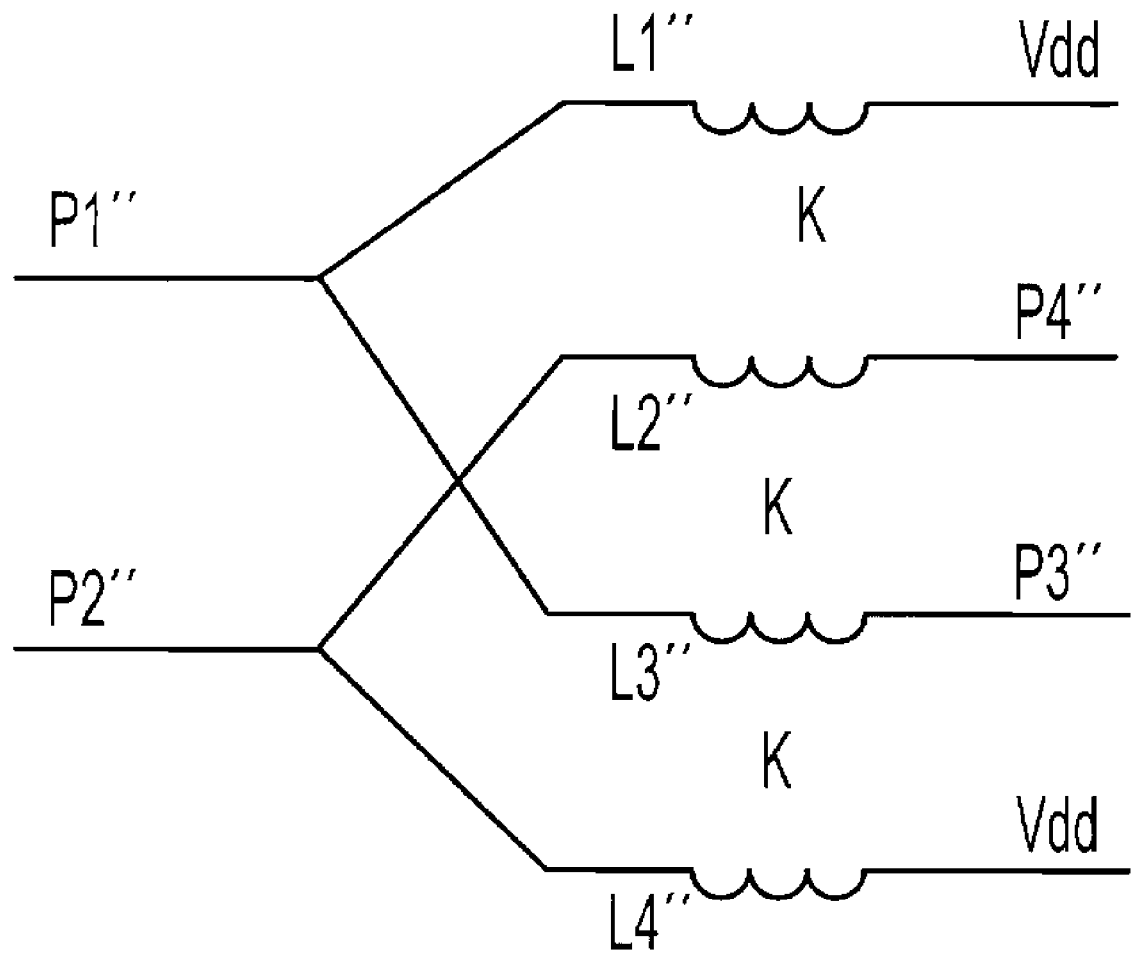
FIG. 4 illustrates the use of system in accordance with the present invention for power amplifier output matching.

FIG. 4 illustrates the application when used for power amplifier (PA) output matching. P1" and P2" are connected to bondpads on chip and those pads are connected to the drains of the PA device. The bondwires L1" and L4" are used as radio frequency choce to supply the DC current to PA and they are connected to the DC supply (Vdd) Pin on package. P3" and P4" are the two package pins connecting to the output matching network on board. The cross connection of P1" and P2" will largely reduce the effective inductance between P1" and P3" (or P2" and P4"). It means the PA has a wideband matching and is less sensitive to components variation.

Figure 5:
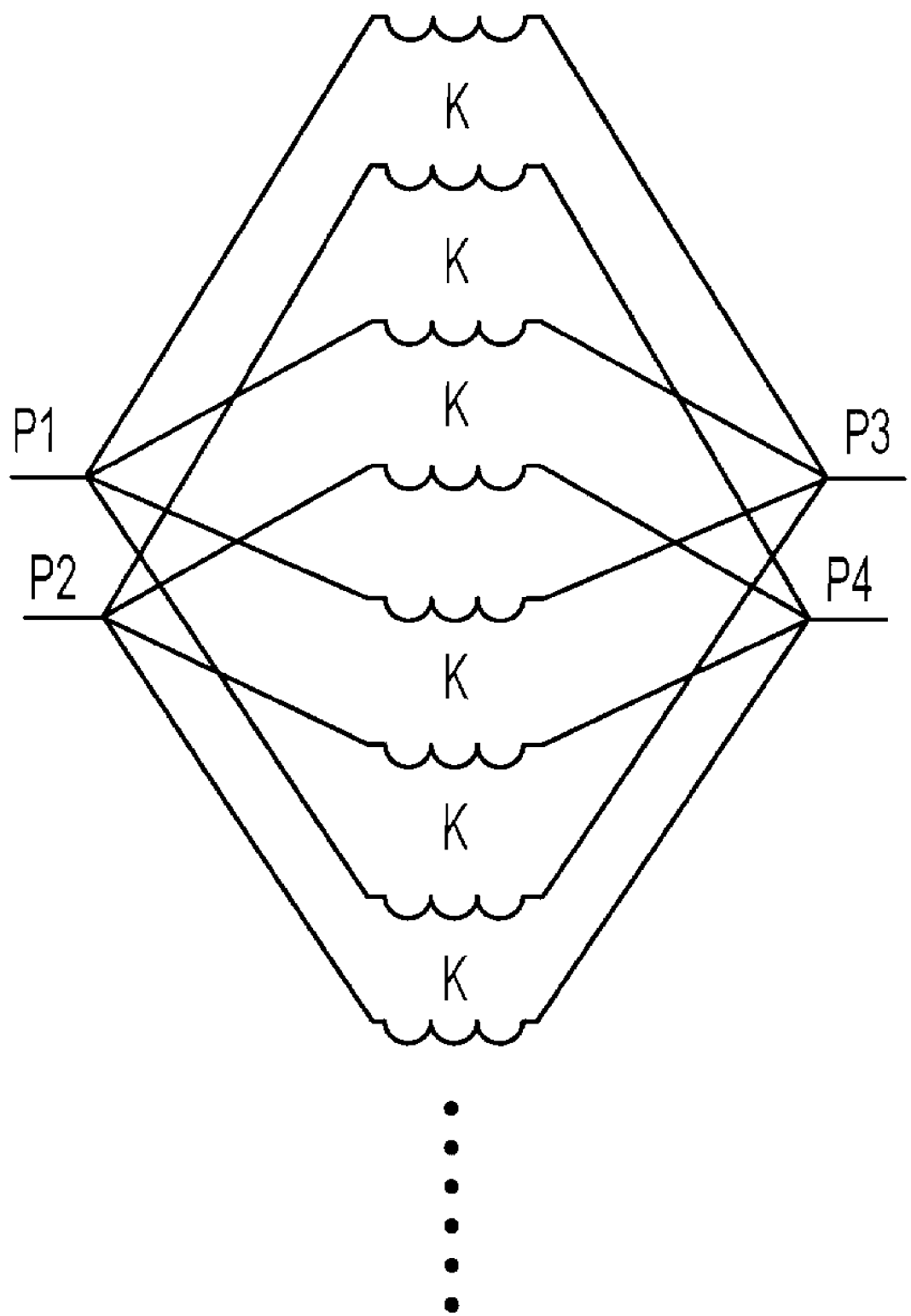
FIG. 5 illustrates the system in accordance with the present invention extended to a more general use.

FIG. 5 is a diagram for the more general case wherein there are N bondwires/traces with cross coupled inputs and outputs.

Accordingly, as is seen a plurality of inputs and outputs can be cross coupled to further reduce the magnetic coupling.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for reducing the inductance on an integrated circuit comprising:
    providing a first differential line, including a first input and a first output, the first differential line including at least two bondwire traces which are coupled in parallel,
    providing a second differential line including a second input and a second output, the second differential line including at least two bondwire traces which are coupled in parallel, the first differential line being of opposite polarity to the second differential line; and
    cross-coupling of the first input with the second input and the first output with the second output to reduce the inductance caused by bondwire traces.

2. The method of claim 1 wherein the first and second inputs are coupled to bondpads on a die and the first and second outputs are coupled to package pins.

3. The method of claim 1 wherein the first and second inputs are coupled to bondpads on a die and the first and second outputs are two pins coupled to an output power matching network.

4. A system comprising:
    a first differential line, including a first input and a first output, the first differential line including at least two bondwire traces which are coupled in parallel,
    a second differential line including a second input and a second output, the second differential line including at least two bondwire traces which are coupled in parallel, the first differential line being of opposite polarity to the second differential line; wherein the first input is cross-coupled with the second input and the first output is cross-coupled with the second output to reduce the inductance caused by bondwire traces.

5. The system of claim 4 wherein the first and second inputs are coupled to bondpads on a die and the first and second outputs are coupled to package pins.

6. The system of claim 4 wherein the first and second inputs are coupled to bondpads on a die and the first and second outputs are two pins coupled to an output power matching network.

* * * * *